US006963442B2

(12) United States Patent
Yap et al.

(10) Patent No.: US 6,963,442 B2
(45) Date of Patent: Nov. 8, 2005

(54) LOW-NOISE, SWITCHABLE RF-LIGHTWAVE SYNTHESIZER

(75) Inventors: Daniel Yap, Newbury Park, CA (US); Yiu-Man So, West Hills, CA (US)

(73) Assignees: HRL Laboratories, LLC, Malibu, CA (US); Raytheon Company, Lexington, MA (US)

(*) Notice: Subject to any disclaimer, the term of this patent is extended or adjusted under 35 U.S.C. 154(b) by 99 days.

(21) Appl. No.: 10/417,011

(22) Filed: Apr. 16, 2003

(65) Prior Publication Data

US 2003/0197917 A1 Oct. 23, 2003

Related U.S. Application Data

(60) Provisional application No. 60/373,739, filed on Apr. 17, 2002.

(51) Int. Cl.[7] .................... G02F 2/02; H04B 10/04; H01S 3/13

(52) U.S. Cl. .................... 359/326; 398/183; 372/32

(58) Field of Search .................... 359/326–332; 398/183, 187, 188, 196; 372/29.011, 29.02, 32, 38.01

(56) References Cited

U.S. PATENT DOCUMENTS

| 5,379,309 | A | 1/1995 | Logan, Jr. ............... 372/18 |
| 5,617,239 | A | 4/1997 | Walker .................. 359/181 |
| 5,687,261 | A | 11/1997 | Logan .................... 385/24 |
| 5,710,651 | A | 1/1998 | Logan, Jr. ............... 359/145 |
| 5,796,506 | A | 8/1998 | Tsai ..................... 359/191 |
| 5,859,611 | A | 1/1999 | Lam et al. ............... 342/368 |
| 6,262,681 | B1 | 7/2001 | Persechini .............. 342/188 |
| 2003/0197918 | A1 | 10/2003 | Ng et al. ................ 359/332 |
| 2003/0227629 | A1 | 12/2003 | Dobbs et al. ............ 356/437 |

FOREIGN PATENT DOCUMENTS

| EP | 0 352 747 | 1/1990 | ........... H04B/10/14 |
| WO | WO 02/099939 A2 * | 12/2002 | ............ H01S/3/23 |

OTHER PUBLICATIONS

Bordonalli, A.C., et al., "High–Performance Phase Locking of Wide Linewidth Semiconductor Lasers by Combined Use of Optical Injection Locking and Optical Phase–Lock Loop," *Journal of Lightwave Technology*, vol. 17, No. 2, pp 328–342 (Feb. 1999).

Johansson, L.A., et al., "Millimeter–Wave Modulated Optical Signal Generation with High Spectral Purity and Wide–Locking Bandwidth Using a Fiber–Integrated Optical Injection Phase–Lock Loop," *IEEE Photonics Technology Letters*, vol. 12, No. 6, pp 690–692 (Jun. 2000).

Kazovsky, L.G., et al., "A 1320–nm Experimental Optical Phase–Locked Loop: Performance Investigation and PSK Homodyne Experiments at 140 Mb/s and 2 Gb/s," *Journal of Lightwave Technology*, vol. 8, No. 9, pp 1414–1425 (Sep. 1990).

(Continued)

*Primary Examiner*—John D. Lee
(74) *Attorney, Agent, or Firm*—Ladas & Parry LLP (57) ABSTRACT

A frequency synthesizer for generating a multiple tone lightwave signal that can be converted into an RF carrier or local oscillator signal. The frequency synthesizer comprises a multiple mode master laser, two slave lasers injection-locked to the master laser, an optical coupler coupling the optical outputs of the two slave lasers, which produces an optical heterodyne output. The frequency synthesizer further comprises a homodyne phase-lock loop providing feedback control over one of the slave lasers and a heterodyne phase-lock loop providing feedback control over the other slave laser. A local oscillator selector is used to select the optical mode to which one of the slave lasers is locked, thus providing selection of the frequencies of the heterodyne output.

38 Claims, 6 Drawing Sheets

OTHER PUBLICATIONS

Kikuchi, K., et al., "Amplitude–Modulation Sideband Injection Locking Characteristics of Semiconductor Lasers and their Application," *Journal of Lightwave Technology*, vol. 6, No. 12, pp 1821–1830 (Dec. 1988).

Ramos, R.T., et al., "Optical Injection Locking and Phase–Lock Loop Combined Systems," *Optics Letters*, vol. 19, No. 1, pp 4–6 (Jan. 1, 1994).

Yap, D., et al., "Agile Waveform Generation & Frequency Conversion," *RF–Lightwave Integrated Circuits Program Kickoff Meeting*, pp DY1–DY10 (Aug. 16, 2000).

Yap, D., et al., "Switched Photonic Link for Distribution of Local– Oscillator Signals," *IEEE Photonics Technology Letters*, vol. 12, No. 11, pp 1552–1554 (Nov. 2000).

*Radio Frequency Photonic Synthesizer*, United Telecommunications Products, Inc., Chalfont, PA, Transmission Systems Division, (Jan. 2000).

Ghirardi, F., et al., "Monolithic Integration of an InP Based Polarization Diversity Heterodyne Photoreceiver with Electrooptic Adjustability," *Journal of Lightwave Technology*, vol. 13, No. 7, pp 1536–1549 (Jul. 1995).

* cited by examiner

LOW-NOISE, SWITCHABLE RF-LIGHTWAVE SYNTHESIZER

CROSS-REFERENCE TO RELATED APPLICATIONS

The present application claims the benefit of U.S. Provisional Application No. 60/373,739, filed Apr. 17, 2002, the contents of which are incorporated by reference herein.

The present document is related to the copending U.S. Provisional Application No. 60/373,742, filed Apr. 17, 2002, and entitled "An Integrated Optical Circuit for Effecting Stable Injection Locking of Laser Diode Pairs Used for Microwave Signal Synthesis." The contents of this related application are hereby incorporated by reference herein.

STATEMENT OF GOVERNMENT INTEREST

This invention was reduced to practice on a RFLICs government Contract No. F3361500-C-1674 with AFRL. The government has certain rights in this invention.

FIELD

The present disclosure relates to generation of lightwave signals. More specifically, the present disclosure relates to the generation of a lightwave signal with variable tones that can be converted into a variable RF carrier or local oscillator signal.

BACKGROUND

Frequency synthesis is used to generate signals at one or more precise frequencies. These signals may then be used to perform frequency conversion in radio frequency (RF) sensor and communication systems. Frequency synthesis may be provided by several different methods. Of concern in frequency synthesis is the phase and frequency stability of the generated signal. Since the generated signal may be used as a local oscillator signal for frequency up-conversion or down-conversion, instability in the signal results in decreased signal-to-noise performance.

One method of frequency synthesis involves the generation of a multiple tone lightwave signal that can be converted into an RF carrier or local oscillator signal. In this method, optical heterodyning is used to create a sum or difference beat frequency between two optical wavelength tones. The sum or difference beat frequency is then detected by a photodetector or similar apparatus to generate an RF carrier or local oscillator signal. However, the stability of the beat frequency signal is limited by the relative stability of the optical wavelength tones to each other. Of course, the relative stability of the optical tones may be affected by the absolute stability of the tones.

Figure 1:
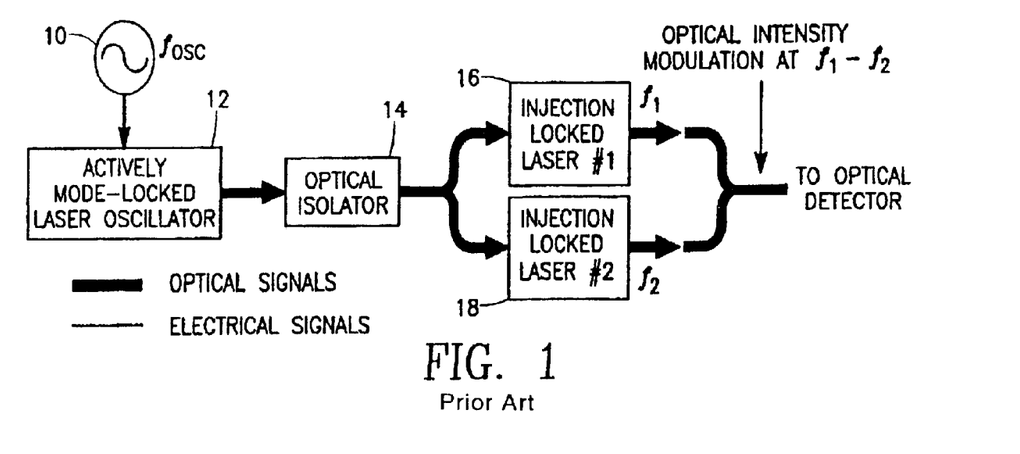
FIG. 1 (prior art) is a schematic diagram of a heterodyne laser oscillator employing two injection-locked lasers.

Logan in U.S. Pat. No. 5,379,309, issued Jan. 3, 1995, describes an optical heterodyning apparatus, shown in FIG. 1, that provides a beat frequency signal with improved stability. In FIG. 1, two slave lasers 16, 18 are injection-locked to different optical modes of a master laser 12 to create two phase-coherent laser signals at different frequencies, $f_1$ and $f_2$. The phase-coherent signals are then combined to create a beat frequency at $f_1-f_2$. Since the master laser 12 is mode-locked, all of the modes have a well-defined phase relationship that is time-invariant. An RF reference oscillator 10 of a fixed frequency is used to mode lock the master laser. The frequency of the RF reference 10 sets the minimum frequency spacing between the modes. Note that the output of the mode-locked master laser is a periodic series of pulses, which results in the output having a frequency spectrum with multiple frequency tones corresponding to multiple modes. The multi-mode master laser 12 is capable of generating hundreds of locked modes spanning more than 100 GHz. Injection-locking the slave lasers 16, 18 to the master laser 12 provides that each slave laser 16, 18 is tuned to have an output frequency that corresponds to only one mode of the multimode output of the master laser 12. The outputs of the slave lasers 16, 18 are continuous wave signals. Therefore, the apparatus disclosed by Logan is capable of generating a large number of possible RF carrier signals or local oscillator signals over a wide frequency range. The frequency of these signals is selected by tuning the slave lasers 16, 18 to select pairs of maser laser modes with a difference in frequency equal to the desired frequency of the RF carrier signals or local oscillator signals to be produced.

In the apparatus disclosed by Logan, in injection-locking the slave lasers 16, 18 to the master laser 12, the stability of the heterodyne beat signal is degraded by the instability of the laser signals produced by the two injection-locked lasers 16, 18. The heterodyne beat signal has phase noise that is several orders of magnitude worse than the heterodyne beat signal that could be directly produced from two modes of the master laser. This degradation in phase noise performance is due to the dependence of the phase noise performance on the linewidths and phase noise characteristics of the free running slave lasers.

Alternative prior art apparatus comprise multiple slave lasers injection-locked to current modulation sidebands of a master semiconductor laser, as disclosed by K. Kihuchi, C. E. Zah, and T. P. Lee in J. Lightwave Technology, v. 6, n. 12, 1988, pp. 1821–1830. However, only a small number of sideband frequency tones are produced. Thus, only a small number of possible RF carrier signals or local oscillator signals may be generated by optically heterodyning the outputs of the slave lasers.

Figure 2:
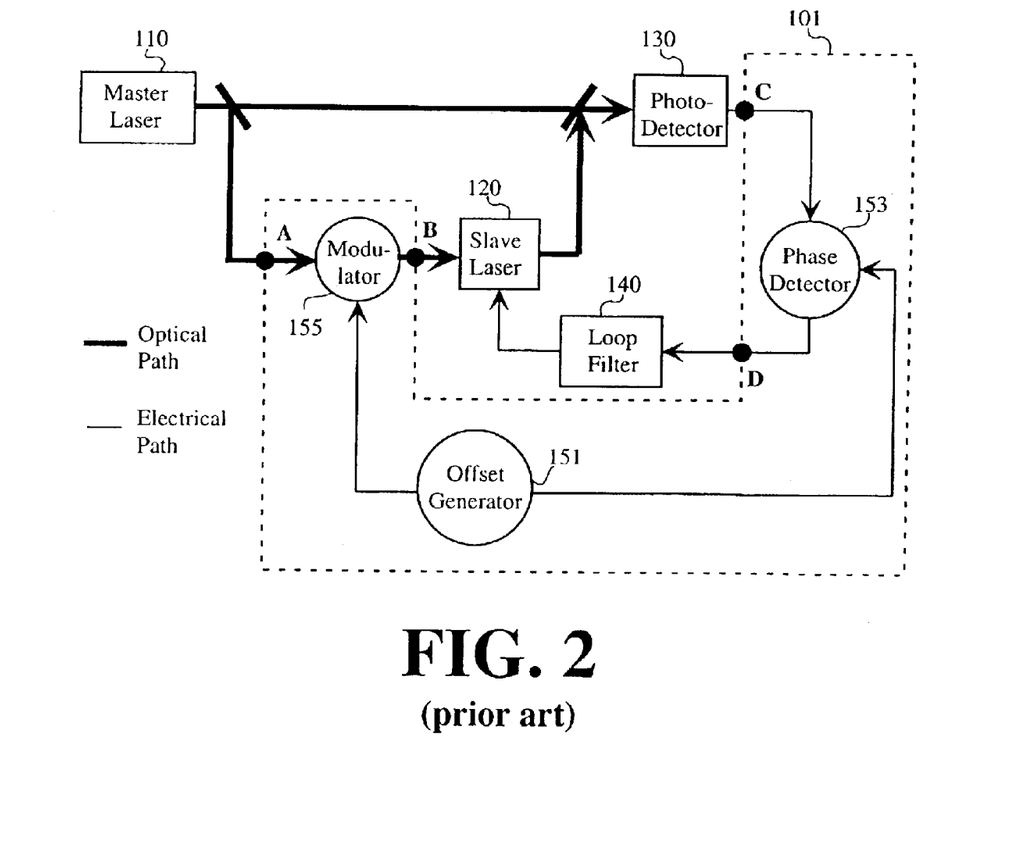
FIG. 2 (prior art) is a block diagram of an apparatus with a slave laser optically injection-locked to a master laser and using either a heterodyne or homodyne phase-lock loop.

Other prior art apparatus combine optical injection locking with an optical phase lock loop. See, for example, R. Ramos, et. al, Optics Letters, vol. 19, no. 1, pp. 4–6,1994; A. C. Bordonalli, C. Walton and A. J. Seeds, J. Lightwave Technology, vol. 17, no. 2, pp. 328–342, 1999; L. A. Johansson and A. J. Seeds, IEEE Photonics Technology Letters, vol. 12, no. 6, pp. 690–692, June 2000. FIG. 2 shows a prior art apparatus in which optical injection locking is used with an optical phase-lock loop.

In FIG. 2, a single slave laser 120 is optically injection locked to a single master laser 110. A photodetector 130 is used to detect the difference between the output of the master laser 110 and the output of the slave laser 120 to generate an error signal. The error signal is then directed to a loop filter 140 that controls the current drive of the slave laser 120. FIG. 2 illustrates a configuration of the prior art apparatus with either a homodyne phase-lock loop or a heterodyne phase lock loop. The heterodyne phase-lock loop is provided by the elements shown within the dotted box 101. The elements of the heterodyne phase-lock loop comprise an offset generator 151, a phase detector 153 and a modulator 155. The modulator 155 receives a continuous wave signal from the offset generator 151 that causes the optical signal from the master laser 110 to have an additional frequency tone and the slave laser 120 locks to this additional frequency tone. The phase detector 153 generates the error signal based on the difference between the signal output by the offset generator and the beat signal generated by the difference between the output of the master laser 110 and the output of the slave laser 120. A homodyne phase-lock loop is provided by removing the components of the heterodyne phase-lock loop depicted within the box 101. Essentially, point A is directly connected to point B on FIG. 2 and point C is directly connected to point D on FIG. 2 to provide an apparatus having a homodyne phase-lock loop. With a homodyne phase-lock loop, the outputs of the master laser 110 and the slave laser 120 should be at the same frequency.

The prior art apparatus depicted in FIG. 2 provides that the constraints of the design of the phase-lock loop may be relaxed by using optical injection locking. However, the measured phase noise is still high (greater than −95 dBc/Hz at 10 KHz offset). The phase noise spectrum still is dependent on the linewidths of both the master and slave lasers, although that dependence is reduced by the loop transfer function.

As discussed above, the beat frequency produced at the photodetector 130 when a heterodyne phase-lock loop is used is equal to the frequency of the offset generator 151. If the heterodyne output is to be switchable among various radio frequency or local oscillator frequencies, the offset generator would also need to be switchable among those same frequencies. Prior art apparatus that use switchable or multiple RF reference signal generators to amplitude modulate the light from a single laser without relying upon optical heterodyning and optical injection are known in the art. See, for example, Daniel Yap, et al., "Switched Photonic Link For Distribution of Local-Oscillator Signals," IEEE Photonics Technology Letters, vol. 12, no. 11, November 2000, pp. 1552–1554. Apparatus that use optical heterodyning and optical injection that also require the use of switchable or multiple RF reference generators provide little advantage over this known art.

Thus, there still exists a need in the art for a switchable frequency synthesizer that can produce a radio frequency carrier or local oscillator signal with low phase noise and minimizes amplitude fluctuations without requiring a switchable RF reference generator or multiple RF reference generators.

SUMMARY

Embodiments of the present invention are based upon a known method for generating a multi-tone lightwave signal that can be converted into a switchable RF carrier or local-oscillator signal. The known method is based on optical heterodyning, in which the (difference) beat frequency between two optical-wavelength tones is used to generate a RF tone. Two different single-tone lasers, such as distributed-feedback laser diodes, produce the two optical wavelength tones. With this method, the phase noise of the RF tone is degraded by the linewidths and other phase noise characteristics of the two single-tone lasers. Embodiments of the present invention achieve a switchable RF tone that has much lower phase noise than prior art apparatus that use only optical injection locking.

Embodiments of the present invention have at least two "slave" lasers that are optical-injection locked to different tones produced by a "master" laser, preferably a multitone, mode-locked laser. An exemplary embodiment that produces a single optical heterodyne output comprises two slave lasers. The two, single-tone, "slave" lasers can be considered as being a primary laser and a secondary laser. An optoelectronic phase-lock loop is used to reduce the linewidth of the primary laser. This loop takes the homodyne outputs of the primary laser and the tone (from the mode-locked laser) used to optical-injection lock that laser to produce a feedback correction signal for the first laser. Another, switchable, optoelectronic phase-lock loop is used to reduce the phase noise of the heterodyne signal produced by combining the outputs of the primary and secondary lasers. This loop converts that heterodyne output into an electronic signal, reduces the frequency of the heterodyne signal with a switchable electronic frequency divider, compares the frequency-divided signal with a low-noise RF reference oscillator, and produces a error signal for feedback correction of the secondary laser. The same RF reference oscillator is also used to phase lock the various tones of the mode-locked laser. Thus, it may even be possible to cancel out some of the phase noise of the mode-locked laser as well.

Different RF-carrier or local-oscillator signal frequencies can be generated by optical-injection locking the two, single-tone, "slave" lasers to different pairs of tones produced by the "master" mode-locked laser. These frequencies occur at discrete steps that correspond to the tone spacing of the mode-locked laser, which is set by the RF reference oscillator. The signal frequency is switched by changing the current-drive or temperature of the secondary laser. The divide-ratio of the electronic frequency divider likewise is switched to match the selected signal frequency.

Embodiments of the present invention achieve the generation of both an RF and a lightwave tone whose phase noise is comparable to the multiplied phase noise of the RF reference. Prior art approaches, which employ only optical-injection locking, still produce heterodyne tones whose phase noise is several orders of magnitude worse than the multiplied phase noise of the RF reference. Embodiments of the present invention use an optoelectronic phase-lock loop to lock the heterodyne output to the RF reference. Thus, the phase noise of that heterodyne output is reduced significantly. Other embodiments of the present invention use both a heterodyne phase-lock loop and a homodyne phase-lock loop to provide feedback signals to both the secondary and the primary lasers. The dual phase-lock loops further reduce the phase noise.

DETAILED DESCRIPTION

The present invention will now be described more fully hereinafter with reference to the accompanying drawings, in which preferred embodiments of the invention are shown. This invention may be embodied in many different forms and should not be construed as limited to the embodiments set forth herein.

Figure 3:
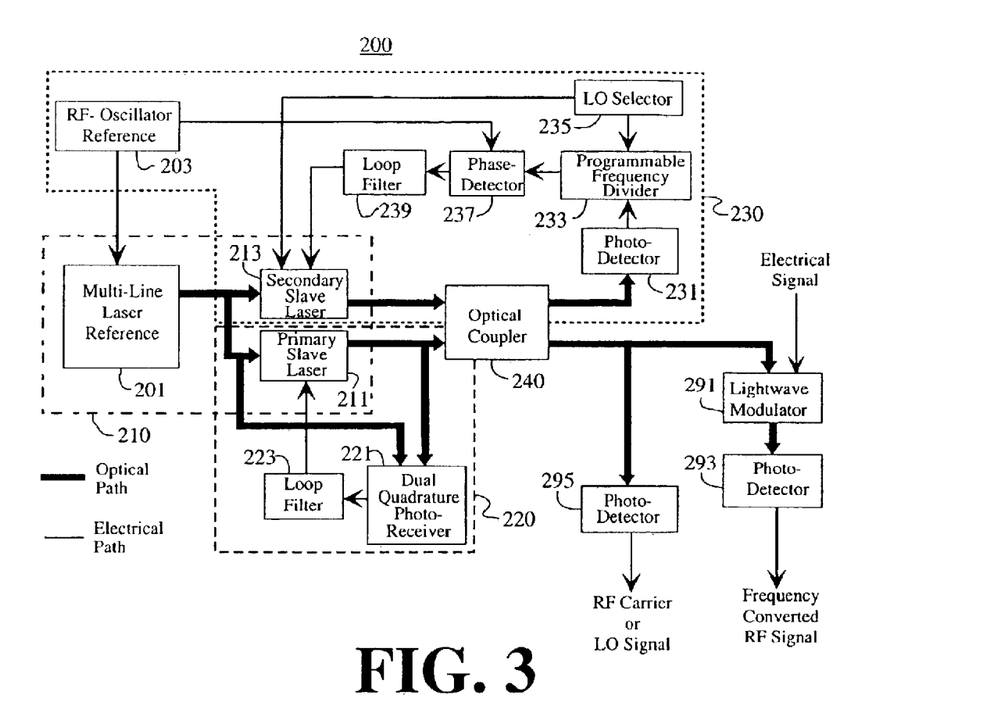
FIG. 3 shows a block diagram of an embodiment of an RF-lightwave synthesizer according to the present invention employing both a homodyne phase-lock loop and a heterodyne phase-lock loop.

An RF-lightwave synthesizer 200 according to the present invention is shown in FIG. 3. The RF-lightwave synthesizer 200 comprises two main subsystems, an optical injection-locking subsystem depicted in FIG. 3 within the dotted box labeled as 210 and an optical heterodyne phase-lock loop, depicted in FIG. 3 within the dotted box labeled as 230. Alternative embodiments of the RF lightwave synthesizer may also include an optical homodyne phase-lock loop, depicted in FIG. 3 within the dotted box labeled as 220. The output from the synthesizer 200 comprises a photonic local-oscillator signal or carrier that can be used as the optical transmitter source for an external-modulation photonic link. Hence, the output may be modulated with an RF signal by a lightwave modulator 291. The optical output, modulated or unmodulated, may then be converted to an electrical signal by a photodetector 293, 295.

The optical-injection locking subsystem comprises a master laser 201, and two single-tone (single wavelength) slave lasers 211, 213, preferably distributed feedback laser diodes. The optical outputs of the slave lasers 211, 213 are combined, preferably through an optical coupler 240, to produce a heterodyne output. The optical coupler 240 may be a fiber coupler, a waveguide coupler, or an integrated optical device providing optical coupling capability. The optical outputs may also be combined with free space optical combiners, such as polarization selective beam splitters/combiners and polarization rotators. Other means for combining the optical outputs of the slave lasers 211, 213 may be used and are generally known to those skilled in the art.

Optical heterodyning of the tones of two separate lasers to produce a local oscillator signal is well-known in the art. As described by Logan, the phase noise of the optical heterodyne output is reduced by injection-locking the two lasers to a single laser source. Preferred embodiments of the present invention have a multi-line (or multi-tone) laser reference 201, that serves as a "master" oscillator for optical-injection locking the tones produced by the two or more single-tone lasers 211, 213, which are considered as the "slave" lasers. The process of optical-injection locking is well known. A preferred version of the multi-line laser reference is a mode-locked laser that is actively locked to a RF-reference oscillator 203. The RF-reference oscillator 203 sets the spacing between the tones of the mode-locked laser 201 and ensures that the tone spacing is correlated, although each tone may itself have larger linewidth. The frequency of the heterodyne output signal can be switched by switching the injection-locking ranges of the "slave" lasers 211, 213 so that they coincide with a different pair of tones from the mode-locked laser 201.

Figure 4:
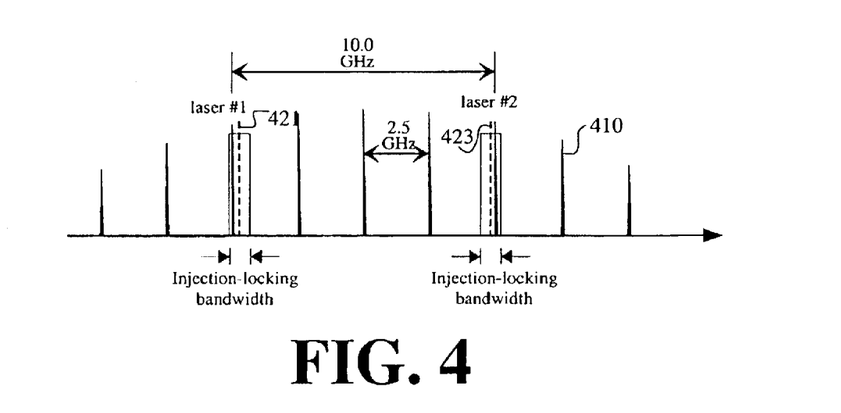
FIG. 4 illustrates the frequency spectrum of the two slave lasers of the synthesizer of FIG. 3 optically injection locked to different tones of the multi-line master laser.

FIG. 4 illustrates an exemplary optical comb 410 that may be generated by the mode-locked laser 201. As shown in FIG. 4, the mode-locked laser 201 generates optical signals separated in frequency by about 2.5 GHz. The slave lasers 211, 213 may be configured to lock to different tones or frequencies of the optical comb 410. FIG. 4 shows the slave lasers 211, 213 locking to separate optical signals that differ in frequency by about 10.0 GHz. Note that the actual optical signals output from the slave lasers 211, 213 when they are not receiving optical injection signals from the master laser 201 (i.e. the slave laser are free-running) may differ slightly from the tones of the optical comb 410. FIG. 4 shows the free-running slave laser optical outputs 421, 423 as being slightly offset (i.e. detuned) from the optical comb frequencies, but within the injection-locking bandwidth of the slave lasers. As long as the optical outputs from the free-running slave lasers 211, 213 stay within the injection-locking bandwidth, the slave lasers 211, 213 will remain locked to the mode-locked laser 201 when optical injection signals are applied to them.

The dual-slave optical-injection locking approach described above generates a heterodyne output whose phase noise tracks that of the RF-reference oscillator, multiplied to the frequency of the heterodyne output. However, there also is an added residual phase noise that is attributed solely to the optical-injection locking approach. The residual phase noise depends primarily on the linewidth of the free-running slave lasers, the optical-injection locking bandwidth of the slave lasers and the detuning. The frequency detuning is the difference between the frequency of the free-running slave laser and the frequency of the tone from the master laser to which the slave is locked. The best value achieved in the prior art is a residual phase noise of approximately −120 dBc/Hz for offsets from the carrier (the peak frequency) of less than 1 MHz.

To minimize the residual phase noise, it is desirable to have a large injection-locking bandwidth and zero detuning. The maximum allowable value for the locking bandwidth is determined by the tone spacing of the mode-locked laser. The homodyne optical phase-lock loop subsystem 220 provides the ability to ensure that one of the slave lasers, the primary laser 211, is set to a detuning of zero. The homodyne optical phase-lock loop subsystem 220 uses the outputs of the multi-tone master laser 201 and the primary slave laser 211. The optical outputs from both the master laser 201 and the primary slave laser 211 are coupled into a dual, quadrature photoreceiver 221. Any difference between the frequencies and phases of those outputs results in an electronic error signal produced by the photoreceiver 221. The photoreceiver 221 is known in the art and may consist of two photodetectors arranged in a quadrature configuration followed in many cases by an electronic preamplifier. The photoreceiver output is fed into a loop filter 223, typically a second-order filter, whose output is combined with the bias current of the primary slave laser 211 to minimize the phase error of the loop. Designs for the loop filter are known in the art.

Figure 6:
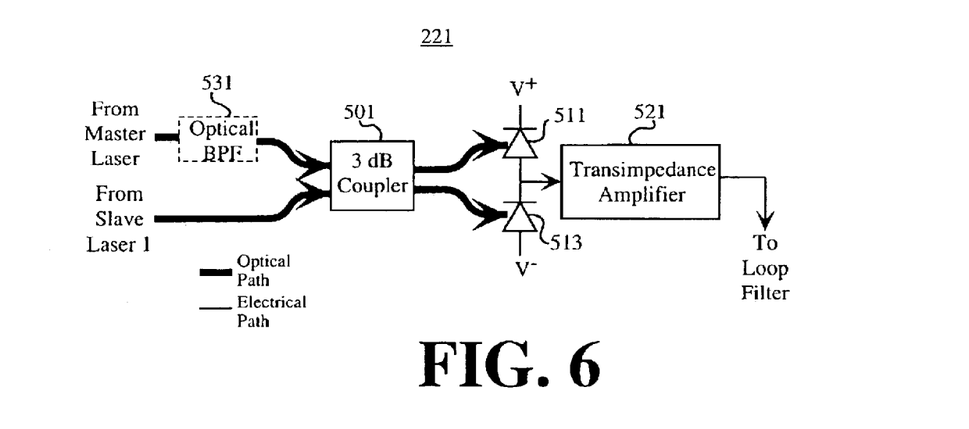
FIG. 6 shows a block diagram of an embodiment of the dual quadrature photoreceiver in the homodyne phase-lock loop of the synthesizer depicted in FIG. 3.

One possible implementation of the quadrature photoreceiver 221 is shown on FIG. 6. This implementation is described by Kazovsky and Atlas in "A 1320-nm Experimental Phase-Locked Loop: Performance Investigation and PSK Homodyne Experiments at 140 MB/s and 2 Gb/s," *Journal of Lightwave Technology*, vol 8, no. 9, September 1990, pp. 1414–1425,. This photoreceiver 221 comprises an optical 3 dB coupler 501 with two optical inputs and two optical outputs. The optical 3 dB coupler 501 is known in the art and may be provided by an integrated optical waveguide device or an optical fiber device.

In the photoreceiver 221 depicted in FIG. 6, the optical inputs of the 3 dB coupler 501 are coupled to the optical outputs of the master laser 201 and the primary slave laser 211. The two optical outputs of the 3 dB coupler 501 each feed one of two photodetector diodes 511, 513. The two photodetector diodes 511, 513 are connected electrically in a reverse-biased balanced and differential configuration, as shown in FIG. 6. The output current produced by the two photodetectors 511, 513 is converted into a voltage by a transimpedance amplifier 521. The output voltage of the transimpedance amplifier is proportional to $\sin(2\pi f_{IF} t + \phi(t))$ where $f_{IF}$ is the difference in frequency between a tone of the master laser 201 and the output of the primary slave laser 211. The phase term $\phi(t)$ arises from the difference between the phases of the master laser tones and the primary slave laser output.

With the configuration of photodetector diodes 511, 513 shown in FIG. 6, the primary slave laser 211 and the master laser 201 are locked in quadrature, that is, the signals from the lasers 201, 211 have a relative phase of 90° to each other. The two lasers may also be coupled with a nominally 0° phase difference, by connecting together the anodes (or the cathodes) of the two photodetectors and connecting that point to the input of the transimpedance amplifier 521. The power supply voltages for the two photodetector diodes should be set to provide a reverse bias voltage over each of the diodes.

In a preferred implementation, a narrow-band optical filter 531 is located between the output of the master laser 201 and its corresponding input to the 3 dB coupler 501. The filter 531 is configured to pass only the tone that is used to optically injection lock the primary slave laser 211. In this configuration of the quadrature photoreceiver 221, $\phi(t)$ represents the phase error between the primary slave laser 211 and the master laser tone to which it should be locked. Thus, the homodyne phase-lock loop 220 with the quadrature photoreceiver 221 counteracts the tendency of the primary slave laser 211 to become detuned. The linewidth of the primary slave laser 211 when it is in its free-running mode of operation indicates the tendency of the primary slave laser 211 to become detuned when injection-locked.

The use of a homodyne phase-lock loop together with optical injection locking of a single-line master laser has been described by R. Rames and by A. C. Bordonalli. However, embodiments of the present invention use a novel combination of a homodyne phase-lock loop with a multi-line master laser. Since it is desirable to use only one line of the master laser 201 for the phase locking, the homodyne phase-lock loop 220 of this invention is preferably band-limited. Thus, the loop filter 223 should have a bandwidth that is much lower than the tone spacing of the mode-locked laser 201, which can be on the order of 1 GHz. The loop filter 223, therefore, typically comprises a passive low-pass filter. Preferably, the primary slave laser 211 has a frequency-modulation response that remains uniform in both amplitude and phase to modulation frequencies beyond that of the desired bandwidth of the loop filter 223.

The primary slave laser 211 is locked both by optical injection as well as by electrical feedback (through the phase-lock loop). The optical injection provides that the primary slave laser 211 tracks slow changes in the frequency of the injected master laser 201 line. Slow changes of the slave laser frequency are also suppressed by the injection locking. The phase fluctuations (or noise) of the primary slave laser 211 become coherent with the phase fluctuations of the injected laser line for the smaller frequency offsets from the center frequency. The center frequency is the frequency that occurs in the absence of phase or frequency fluctuations. More rapid changes in the frequency of the injected master laser line are only partially tracked by a primary slave laser 211 locked to the master laser 201. Similarly, more rapid changes of the slave laser frequency are only partially suppressed. The phase-lock loop (i.e. the electrical feedback) is designed to compensate for these more rapid changes. As a consequence, the phase-lock loop preferably has a filter bandwidth greater than the line width of the master laser 201 and the primary slave laser 211. The effect of the phase-lock loop on the optical-injection locked primary slave laser 211 is to reduce its phase deviation from the master laser 201 for those frequency offsets that are within the filter bandwidth. For many sensor applications, such as radar, the range of frequency offsets that are of interest is below 1 MHz and is within the attainable bandwidth of the phase-lock loop.

The homodyne phase-lock loop controls the drive current or temperature of the primary slave laser 211 to ensure that the detuning of the primary slave laser 211 is set to zero. However, the phase noise of the heterodyne output is degraded because of the finite linewidths of both of the slave lasers 211, 213. The homodyne phase-lock loop subsystem 220 reduces the degradation due to the linewidth of the primary slave laser 211. The heterodyne phase-lock loop subsystem reduces the degradation due to the linewidth of the secondary slave laser 213.

The heterodyne phase-lock loop subsystem 230 comprises the two slave lasers 211, 213, the optical coupler 240 that combines their outputs, a monitor photodetector 231 that generates the heterodyne (typically a difference frequency) signal, a programmable frequency divider 233, an electronic phase detector 237 and a loop filter 239. The RF oscillator 203 provides a reference signal to the phase detector 237. Any difference between the frequency divided heterodyne signal and the reference signal produces an error signal that is used to adjust the secondary slave laser 213.

The selection of the frequency divider ratio is described next. For example, if the two slave lasers 211, 213 are biased so that their optical-injection locking bands match immediately adjacent tones of the master laser 201, then the heterodyne output frequency is the same as the frequency of the RF-oscillator reference 203. If the tones of the slave laser 211, 213 match the tones of the master laser 201 that are 2 tone spacings apart, then the frequency divide ratio should be 2. Similarly, if the slave laser tones match master-laser tones that are N tone spacings apart, then the frequency divide ratio should be N. The local-oscillator (LO) selector 235 selects both the divide ratio and the free running frequency of the secondary slave laser 213.

Figure 7:
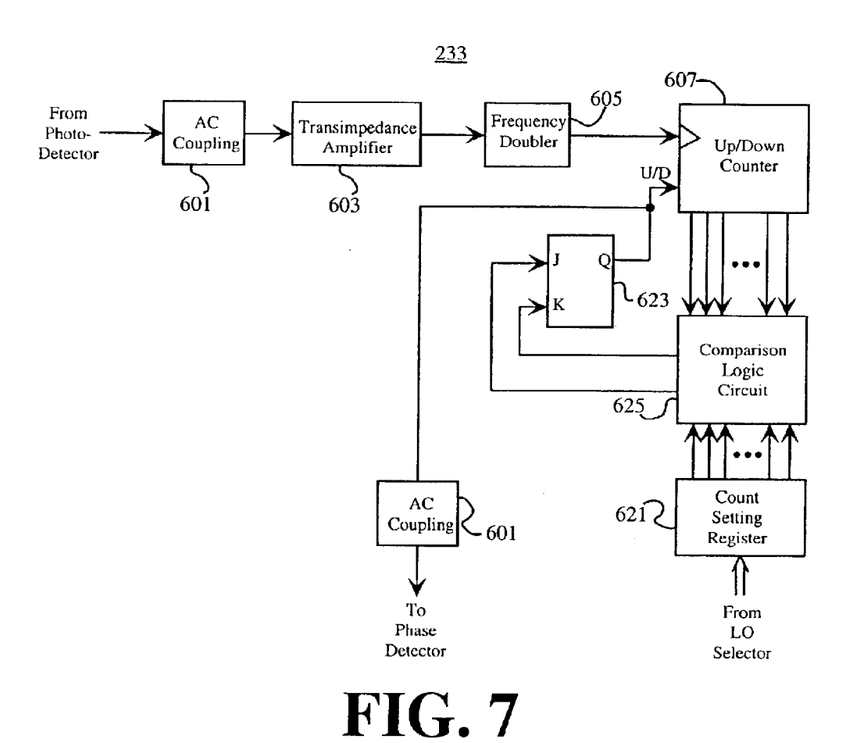
FIG. 7 shows a block diagram of an embodiment of the programmable frequency divider in the heterodyne phase-lock loop of the synthesizer depicted in FIG. 3.

One possible implementation of the programmable frequency divider 233 is shown in FIG. 7. As shown in FIG. 7, the heterodyne output of the photodetector 231 is a current that is preferably coupled by an AC coupling means 601 into a transimpedance amplifier 603. The voltage output of the transimpedance amplifier 603 is directed into a frequency doubler circuit 605. The output of this circuit 605 is an electrical signal that has a frequency that is twice that of the heterodyne signal. Frequency doubler circuits are well-known in the art and may be realized in many ways. One such way comprises the combination of a rectifier and a high-pass filter. The doubled frequency signal that is output from the frequency doubler circuit 605 serves as the clock for a counter 607, which produces the desired frequency divided signal.

FIG. 7 also shows an exemplary implementation of the counter 607, although other implementations known in the art may be used. An up/down counter circuit is used for the counter, along with a register 621 for the desired count, a J/K flip-flop 623, and some comparison logic 625. The counter 607 counts up until its value equals the desired divide ratio. Then the counter 607 counts back down until its value equals zero. The cycle then repeats and the counter 607 counts up to the desired divide ratio. The output of the J/K flip-flop 623 controls the direction of the counter 607. The output of the J/K flip-flop 623 is preferably AC coupled by an AC coupling means 601 from the circuit 233 and serves as the phase indication signal, which is the output of the programmable frequency divider 233.

The phase indication signal should have the same frequency as the RF oscillator reference. Both the phase indication signal and the RF oscillator reference signal are fed to an RF phase detector 237 which may be implemented as an RF mixer. The output of the phase detector 237 has a spectral content near DC as wells as at harmonics of the phase indication signal frequency. However, only the information near DC is passed by the loop filter 239.

The same benefits discussed earlier of combining a homodyne phase-lock loop with an optical-injection locked slave laser also apply to combining a heterodyne phase-lock loop with an optical-injection locked slave laser. Since the heterodyne output is compared with the RF-oscillator reference 203, the degrading effects of the linewidths of the master laser 201 and the slave lasers 211, 213 are diminished. Also, note that the primary laser 211 tracks the mode-locked laser tone as a result of the homodyne phase-lock loop subsystem 220. Two methods are employed to reduce the phase noise of the heterodyne output. The tone optically injected into the secondary slave laser 213 is separated (in frequency) from the tone optically injected into the primary slave laser 211 by an amount that is determined by the RF-oscillator reference that actively mode-locks the master laser 201. Furthermore, the frequency separation between the optical outputs of the primary and secondary slave lasers 211, 213 is corrected by means of the heterodyne phase-lock loop subsystem 230, which has the same RF-oscillator as a reference. Thus, since the same RF oscillator 203 is used to both generate the heterodyne signal (through the mode-locked laser and the optical-injection locking process) and produce the phase-correction signal for the heterodyne phase-lock loop, the phase noise contributed by the mode-locked master laser 201 is suppressed to some extent.

The optical heterodyne output from the optical coupler 240 of the synthesizer 200 has tones at the sums and differences of the tones of the slave lasers 211, 213. When the combined output is converted by a photodetector into an electric signal, the frequencies of the electric signal typically are the difference frequency components (since the photodetector has a loss pass filter response). Where an embodiment of the present invention uses two slave lasers, the difference frequency of the two tones of the slave lasers can be considered a local oscillator (LO) frequency. Hence, the output from a photodetector 295 directly coupled to the output of the optical coupler 240 produces an electrical signal that may be an RF carrier signal or a LO signal.

Application of another RF signal to the output of the optical coupler 240 with an external modulator 291 provides that the applied RF signal can be frequency-converted to an intermediate frequency (IF). The modulated optical signal may then be converted to an electrical signal by a photodetector 293. A mathematical expression for this process is shown below, assuming that the modulator 291 has the transfer function of a Mach-Zehnder interferometer:

$$i_D = \frac{\alpha I_0}{2L_{MOD}}$$

$$\{1 + m\sin(\omega_{RF}t) + M\cos(\omega_{LO}t + \phi) \pm \frac{1}{2}mM\sin[(\omega_{LO} \pm \omega_{RF})t - \phi]\}$$

where $i_d$ represents the photocurrent produced by a photodetector 293 detecting the modulated light signal, $\omega_{RF}$ represents the frequency of the RF signal to be frequency converted, and $\omega_{LO}$ represents the local oscillator frequency produced by the frequency synthesizer 200. Preferably, the frequency response of the external modulator 291 extends beyond $$\frac{1}{2\pi}\omega_{RF}$$

to allow the RF signal to be modulated without any bandwidth limitations. Preferably, the frequency response of the photodetector 293 extends beyond $$\frac{1}{2\pi}\omega_{LO}$$

to allow the optical signal (modulated or unmodulated) to be converted to an electrical signal without bandwidth limitations. Note that if the input electrical signal is to be upconverted in frequency, the frequency response of the photodetector 293 should be at least $$\frac{1}{2\pi}(\omega_{LO} + \omega_{RF}).$$

Hence, embodiments of the present invention may provide generation of optical local oscillator signals that can be optically modulated by RF signals and then frequency converted via optoelectronic techniques into RF signals that have been shifted in frequency. Other embodiments of the present invention may maintain the modulated optical signal in its optical form for transmission via an optical fiber. Embodiments of the present invention may also be used to produce a strictly RF signal with low multiplied phase noise that may be used as an RF carrier or local oscillator reference.

Figure 5:
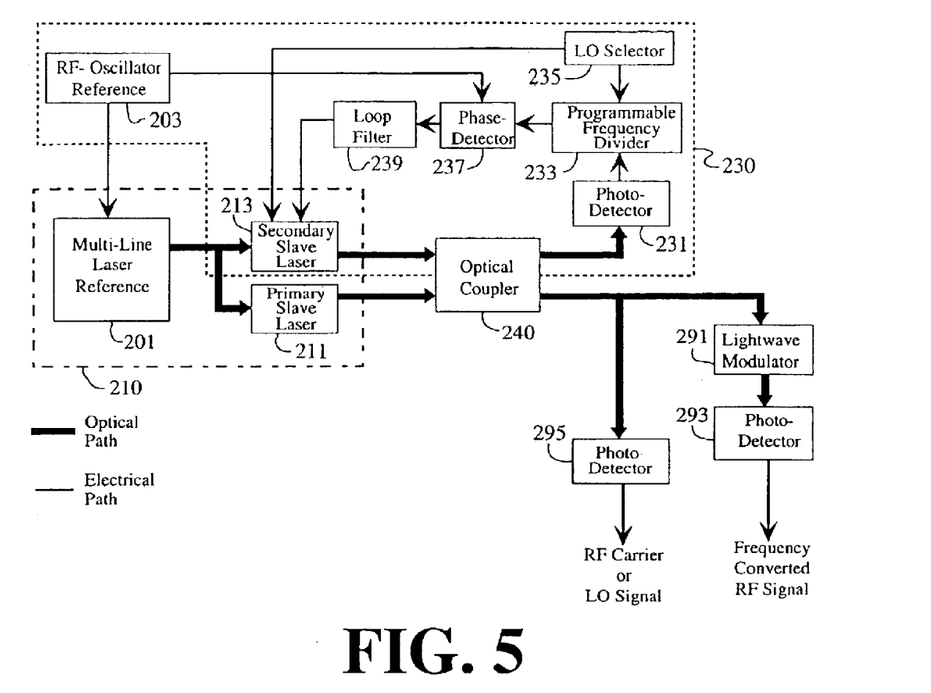
FIG. 5 shows a block diagram of an embodiment of an RF-lightwave synthesizer according to the present invention employing only a heterodyne phase-lock loop.

As noted above, alternative embodiments of the present invention may comprise only a heterodyne phase-lock loop. FIG. 5 shows an embodiment of the present invention where the heterodyne phase-lock loop controls the secondary slave laser 213, but no homodyne phase-lock loop is used to control the primary slave laser 211. This embodiment of the present invention may exhibit slightly higher noise characteristics than the embodiment depicted in FIG. 3, but is less complex, due to the elimination of the homodyne phase-lock loop.

A synthesizer that can simultaneously generate several LO signals or carriers may be realized by having additional secondary slave lasers, and possibly also additional primary slave lasers. Each pair of primary and secondary slave lasers will generate a separate heterodyne output signal and can be controlled by a separate heterodyne phase-lock loop. Also each pair of primary and secondary slave lasers will be optical-injection locked to a pair of tones produced by the master, multi-line laser reference. In order to generate heterodyne outputs that are of different frequencies, these pairs of slave lasers would be optical-injection locked to master laser tones that have different spacings. What is important is the tone spacing rather than the particular tone of the master laser. The same tone from the master laser could be used to optical injection lock several slave lasers, which could be from different slave-laser pairs.

Figure 8:
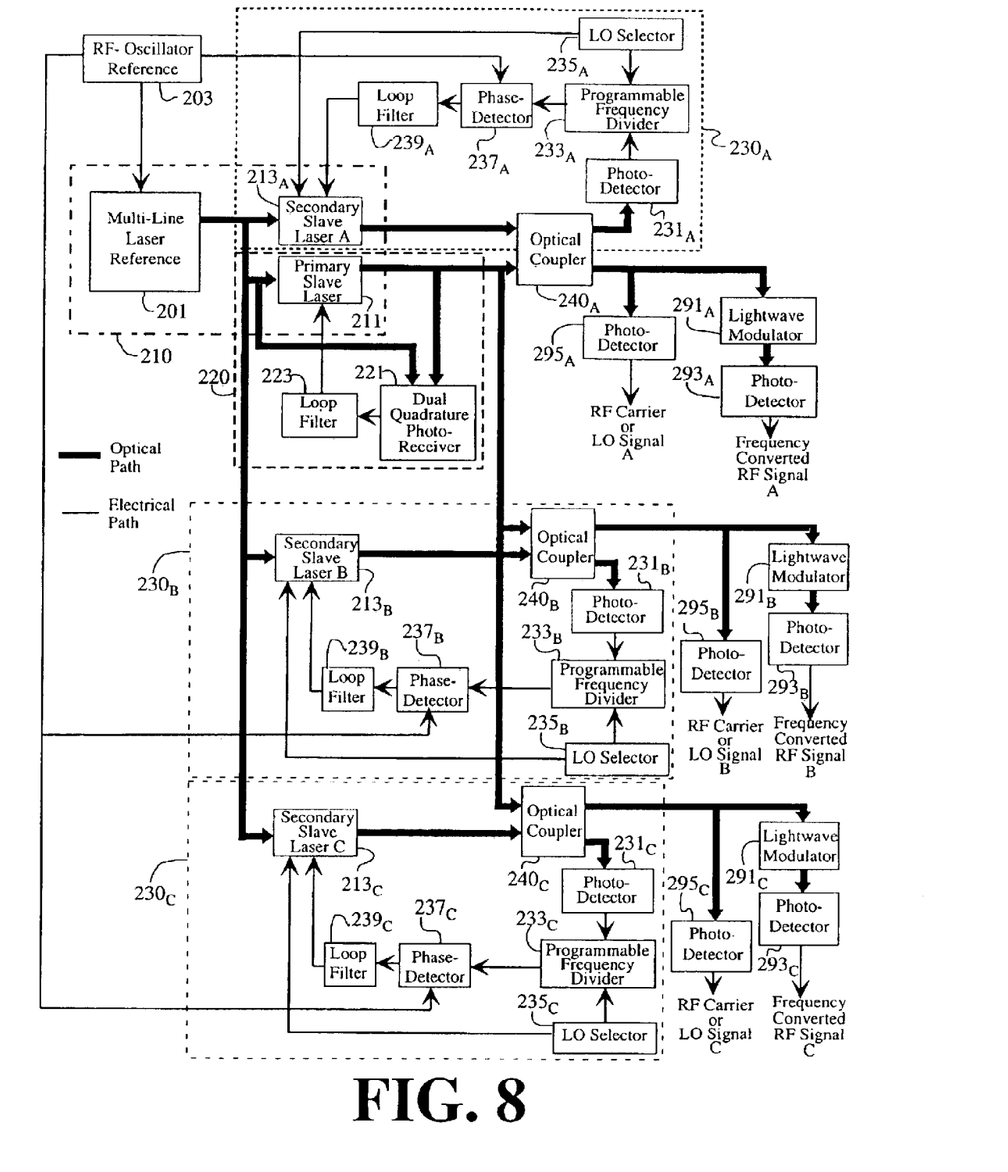
FIG. 8 shows a block diagram of an embodiment of an RF-lightwave synthesizer according to the present invention synthesizing multiple RF frequencies by using multiple heterodyne phase-lock loops.

FIG. 8 depicts an embodiment of the present invention in which multiple heterodyne phase-lock loops $230_{A,B,C}$ are used to generate multiple RF Carrier or LO signals and/or multiple modulated RF signals. The frequency synthesizer depicted in FIG. 8 comprises a master mode-locked laser 201, an RF oscillator reference 203, and a homodyne phase-lock loop 220. However, a separate heterodyne phase-lock loop $230_{A,B,C}$ is used for each separate RF frequency output. As discussed above, each heterodyne phase-lock loop $230_{A,B,C}$ comprises a secondary slave laser $213_{A,B,C}$, an optical coupler $240_{A,B,C}$ receiving the output from the primary slave laser 211 and the secondary slave laser $213_{A,B,C}$, a photodetector $231_{A,B,C}$, a programmable frequency divider $233_{A,B,C}$, an LO selector $235_{A,B,C}$, a phase detector $237_{A,B,C}$, and a loop filter $239_{A,B,C}$. Each secondary slave laser $213_{A,B,C}$ may be injection-locked to a different mode of the master laser 201, such that the RF signal derived from the output of each optical coupler $240_{A,B,C}$ will be at a different frequency. An RF carrier or LO signal may be produced by using a photodetector $295_{A,B,C}$ to convert the optical signal from the optical coupler $240_{A,B,C}$ to an electrical signal. A modulated RF signal may be produced by using a lightwave modulator $291_{A,B,C}$ to modulate the optical signal and then a photodetector $293_{A,B,C}$ to convert the optical signal to an electrical signal. Note also that, as previously discussed, other embodiments of the present invention producing multiple RF frequency outputs may also forego the use of a homodyne phase-lock loop 220 for controlling the primary slave laser 211.

Figure 9:
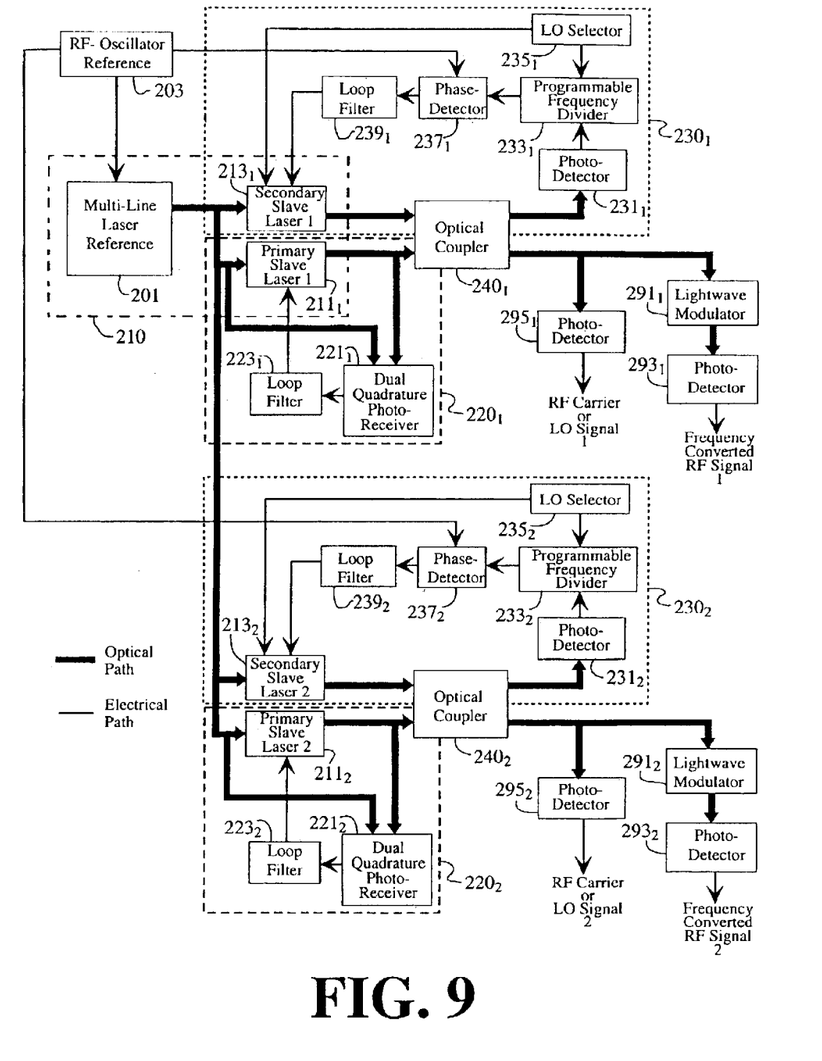
FIG. 9 shows a block diagram of an embodiment of an RF-lightwave synthesizer according to the present invention synthesizing multiple RF frequencies by using multiple pairs of heterodyne and homodyne phase lock loops.

Multiple pairs of primary and secondary slave lasers may also be used to generate multiple RF frequency outputs as shown in FIG. 9. The RF oscillator reference 203 controls the master laser 201 to produce an optical comb with multiple modes. The output of the master laser 201 is then coupled to each pair of primary slave lasers $211_{1,2}$ and secondary slave lasers $213_{1,2}$. As previously discussed, heterodyne phase-lock loops $230_{1,2}$ are used to control the output of each secondary slave laser $213_{1,2}$. Homodyne phase-lock loops $220_{1,2}$ may be used to control the output of each primary slave laser $211_{1,2}$. Alternative embodiments of the frequency synthesizer using multiple pairs of primary and secondary slave lasers may not use homodyne phase-lock loops to control the primary slave lasers $211_{1,2}$. Use of multiple pairs of primary and secondary slave lasers to produce multiple RF frequency outputs permits independent matching of the primary and secondary slave laser output powers. This power matching improves the efficiency of the heterodyning process.

From the foregoing description, it will be apparent to those skilled in the art that the present invention has a number of advantages, some of which have been described herein, and others of which are inherent in the embodiments of the invention described herein. Also, it will be understood that modifications can be made to the frequency synthesizer described herein without departing from the teachings of subject matter described herein. As such, the invention is not to be limited to the described embodiments except as required by the appended claims.

What is claimed is:

1. A frequency synthesizer comprising:
   a reference oscillator having a reference frequency;
   a master laser coupled to the reference oscillator and generating a master optical output having multiple optical modes, the multiple optical modes being at different mode frequencies and related to the reference frequency;
   a primary slave laser receiving the master optical output and being tuned to one of the multiple optical modes to generate a primary slave optical output;
   a secondary slave laser receiving the master optical output and being tuned to a different one of the optical modes to generate a secondary slave optical output;
   an optical coupler receiving the primary slave optical output and the secondary slave optical output and producing an optical local oscillator output; and
   a switchable heterodyne phase-lock loop receiving the optical local oscillator output and the reference frequency and producing a secondary feedback correction signal for the secondary slave laser.

2. The frequency synthesizer of claim 1 wherein the master laser is a mode-locked laser actively locked to the reference frequency.

3. The frequency synthesizer of claim 1, wherein the primary slave laser and the secondary slave laser are injection-locked to the master laser.

4. The frequency synthesizer of claim 3, wherein the primary slave laser and the secondary slave laser are distributed feedback laser diodes.

5. The frequency synthesizer of claim 1, wherein the switchable heterodyne phase-lock loop comprises:
   a monitor photodetector receiving the optical local oscillator output and generating an electrical heterodyne signal;
   a programmable frequency divider receiving the electrical heterodyne signal and producing a frequency divided signal;
   a phase detector receiving the frequency divided signal and the reference frequency and producing a heterodyne error signal;
   a loop filter receiving the heterodyne error signal and producing the secondary feedback correction signal; and
   a local oscillator selector selecting a divide ratio for the programmable frequency divider and selecting the optical mode to which the secondary laser is tuned.

6. The frequency synthesizer of claim 5 wherein the electrical heterodyne signal is a signal having a frequency at a difference between the frequency of the primary optical output and the secondary optical output.

7. The frequency synthesizer of claim 5, wherein the programmable frequency divider comprises one or more counters clocked by a clocking signal derived from the electrical heterodyne signal.

8. The frequency synthesizer of claim 7, wherein the clocking signal has a frequency that is double the frequency of the electrical heterodyne signal.

9. The frequency synthesizer of claim 1 further comprising a homodyne phase-lock loop receiving the primary slave optical output and the master optical output and producing a primary feedback correction signal for the primary slave laser.

10. The frequency synthesizer of claim 9, wherein the homodyne phase-lock loop comprises:
    a dual, quadrature photoreceiver receiving the primary slave optical output and the master optical output and producing an electronic error signal; and
    a loop filter receiving the electronic error signal and producing the primary feedback correction signal.

11. The frequency synthesizer of claim 9, wherein the homodyne phase-lock loop further comprises one or more bandpass filters that select only a single optical mode of the master optical output for producing the primary feedback correction signal.

12. The frequency synthesizer of claim 11, wherein at least one bandpass filter of the one or more bandpass filters comprises an optical filter.

13. The frequency synthesizer of claim 11, wherein at least one bandpass filter of the one or more bandpass filters comprises an electrical filter.

14. A method of producing a local oscillator signal comprising the steps of:
  generating a reference frequency signal;
  generating a master optical signal based on the reference frequency signal, the master optical signal having multiple modes, each of the multiple modes having a different optical frequency;
  generating a primary slave optical signal having a primary slave signal frequency at or near a frequency of one of the multiple modes of the master optical signal;
  generating a secondary slave optical signal having a secondary slave signal frequency different than the primary slave signal frequency and at or near a frequency of one of the multiple modes of the master optical signal;
  coupling the primary slave optical signal and the secondary slave optical signal to produce a local oscillator optical signal; and
  combining the local oscillator optical signal and the reference frequency signal to produce a secondary slave correction signal to control the secondary slave signal frequency.

15. The method of claim 14, wherein the step of generating a primary slave optical signal comprises the steps of:
  injection-coupling the master optical signal to a primary slave laser; and
  controlling the primary slave laser to generate the primary slave optical signal.

16. The method of claim 14, wherein the step of generating a secondary slave optical signal comprises the steps of:
  injection-coupling the master optical signal to a secondary slave laser; and
  controlling the secondary slave laser to generate the secondary slave optical signal.

17. The method of claim 16, wherein the step combining the local oscillator optical signal and the reference frequency signal comprises providing the local oscillator optical signal and the reference frequency signal to a heterodyne phase-lock loop producing a secondary feedback control signal coupled to the secondary slave laser.

18. The method of claim 17, wherein the heterodyne phase-lock loop comprises:
  a monitor photodetector receiving the optical local oscillator signal and generating an electrical heterodyne signal;
  a programmable frequency divider receiving the electrical heterodyne signal and producing a frequency divided signal;
  a mixer receiving the frequency divided signal and the reference frequency and producing a heterodyne error signal;
  a loop filter receiving the heterodyne error signal and producing the secondary feedback correction signal; and
  a local oscillator selector selecting a divide ratio for the programmable frequency divider and selecting the secondary slave signal frequency.

19. The method of claim 18 wherein the electrical heterodyne signal is a signal having a frequency at a difference between the frequency of the primary optical output and the secondary optical output.

20. The method of claim 18, wherein the programmable frequency divider comprises one or more counters clocked by a clocking signal derived from the electrical heterodyne signal.

21. The method of claim 20, wherein the clocking signal has a frequency that is double the frequency of the electrical heterodyne signal.

22. The method of claim 15 further comprising the step of combining the primary slave optical signal and the master optical signal to produce a primary slave correction signal to control the primary slave laser.

23. The method of claim 22, wherein the step of combining the primary slave optical signal and the master optical signal comprises providing the primary slave optical signal and the master optical signal to a homodyne phase-lock loop producing a primary feedback control signal coupled to the primary slave laser.

24. The method of claim 23 wherein the homodyne phase-locked loop comprises:
  a dual, quadrature photoreceiver receiving the primary slave optical signal and the master optical signal and producing an electronic error signal; and
  a loop filter receiving the electronic error signal and producing the primary feedback control signal.

25. The method of claim 24, wherein the loop filter comprises a second order filter.

26. The method of claim 23, wherein the homodyne phase-lock loop further comprises one or more bandpass filters that select only a single optical mode of the master optical output for producing the primary feedback correction signal.

27. The method of claim 26, wherein at least one bandpass filter of the one or more bandpass filters comprises an optical filter.

28. The method of claim 26, wherein at least one bandpass filter of the one or more bandpass filters comprises an electrical filter.

29. A frequency synthesizer having one or more local oscillator outputs, the frequency synthesizer comprising:
  an oscillator generating a reference signal at a reference frequency;
  a master laser receiving the reference signal and generating a master optical output having multiple optical modes, the multiple optical modes being at different mode frequencies and related to the reference frequency;
  means for generating a primary slave optical output; and
  at least one optical local oscillator output circuit, each optical local oscillator output circuit producing a local oscillator output of the one or more local oscillator outputs, each optical local oscillator circuit comprising;
    a secondary slave laser receiving the master optical output and being tuned to one of the multiple optical modes to generate a secondary slave optical output;
    an optical coupler receiving the primary slave optical output and the secondary slave optical output and producing the optical local oscillator output; and
    a switchable heterodyne phase-lock loop receiving the optical local oscillator output and the reference signal and producing a secondary feedback correction signal coupled to the secondary slave laser.

30. The frequency synthesizer of claim 29, wherein the switchable heterodyne phase-lock loop comprises:
  a monitor photodetector receiving the optical local oscillator output and generating an electrical heterodyne signal;
  a programmable frequency divider receiving the electrical heterodyne signal and producing a frequency divided signal;
  a phase detector receiving the frequency divided signal and the reference frequency and producing a heterodyne error signal;

a loop filter receiving the heterodyne error signal and producing the secondary feedback correction signal; and a local oscillator selector selecting a divide ratio for the programmable frequency divider and selecting the optical mode to which the secondary laser is tuned.

31. The frequency synthesizer of claim 29, wherein said means for generating a primary slave optical output comprises a primary slave laser receiving the master optical output, said primary slave laser being injection-locked to a mode of the multiple optical modes.

32. The frequency synthesizer of claim 31, further comprising a homodyne phase-lock loop receiving the primary slave optical output and the master optical output and producing a primary feedback correction signal coupled to the primary slave laser.

33. The frequency synthesizer of claim 32, wherein the master optical output has a master linewidth, the primary slave optical output has a primary linewidth and the homodyne phase-lock loop has a filter bandwidth greater than the master linewidth and the primary linewidth.

34. The frequency synthesizer of claim 29 wherein said means for generating a primary slave optical output comprises a plurality of primary slave lasers, each primary slave laser receiving the master optical output and being injection-locked to a mode of the multiple optical modes and each local oscillator circuit further comprises a corresponding primary slave laser of the plurality of primary slave lasers, the corresponding primary slave laser providing the primary slave optical output to the optical coupler of the local oscillator circuit.

35. The frequency synthesizer of claim 34, wherein each local oscillator circuit further comprises a homodyne phase-lock loop receiving the primary slave optical output of the corresponding primary slave laser and the master optical output and producing a primary feedback correction signal coupled to the corresponding primary slave laser.

36. The frequency synthesizer of claim 35, wherein the master optical output has a master linewidth, the primary slave optical output of each corresponding primary slave laser has a corresponding primary linewidth and each homodyne phase-lock loop has a filter bandwidth greater than the master linewidth and the corresponding primary linewidth.

37. A frequency converter receiving an input electrical signal at a first frequency and producing an electrical carrier signal at a second frequency and a modulated electrical signal at the second frequency, the frequency converter comprising:

a reference oscillator generating a reference signal at a reference frequency;

a master laser coupled to the reference oscillator and generating a master optical output having multiple optical modes, the multiple optical modes being at different mode frequencies and related to the reference frequency;

a primary slave laser receiving the master optical output and being tuned to one of the multiple optical modes to generate a primary slave optical output;

a secondary slave laser receiving the master optical output and being tuned to a different one of the optical modes to generate a secondary slave optical output;

an optical coupler receiving the primary slave optical output and the secondary slave optical output and producing an optical local oscillator output;

a switchable heterodyne phase-lock loop receiving the optical local oscillator output and the reference frequency and producing a secondary feedback correction signal for the secondary slave laser a band-limited homodyne phase-lock loop receiving the primary slave optical output and the master optical output and producing a primary feedback correction signal coupled to the primary slave laser;

a first photo-detector receiving the optical local oscillator output and producing the electrical carrier signal at the second frequency a lightwave modulator receiving the optical local oscillator output and the input electrical signal and producing a modulated optical output signal; and a second photo-detector receiving the modulated optical output signal and producing the modulated electrical signal at the second frequency.

38. The frequency converter of claim 37, wherein the master optical output has a master linewidth, the primary slave optical output has a primary linewidth and the homodyne phase-lock loop has a filter bandwidth greater than the master linewidth and the primary linewidth.

* * * * *